(12) United States Patent
Nakamura et al.

(10) Patent No.: US 7,872,281 B2
(45) Date of Patent: Jan. 18, 2011

(54) GLASS-COATED LIGHT-EMITTING ELEMENT, LIGHT-EMITTING ELEMENT-ATTACHED WIRING BOARD, METHOD FOR PRODUCING LIGHT-EMITTING ELEMENT-ATTACHED WIRING BOARD, LIGHTING DEVICE AND PROJECTOR

(75) Inventors: Nobuhiro Nakamura, Tokyo (JP); Minoru Sekine, Tokyo (JP); Syuji Matsumoto, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/385,351

(22) Filed: Apr. 6, 2009

(65) Prior Publication Data
US 2009/0239318 A1 Sep. 24, 2009

Related U.S. Application Data

(63) Continuation of application No. PCT/JP2007/069623, filed on Oct. 5, 2007.

(30) Foreign Application Priority Data

| Oct. 5, 2006 | (JP) | 2006-274017 |
| Nov. 7, 2006 | (JP) | 2006-301558 |
| Apr. 19, 2007 | (JP) | 2007-110331 |

(51) Int. Cl.
*H01L 29/207* (2006.01)
(52) U.S. Cl. .................... 257/99; 257/E33.068
(58) Field of Classification Search .......... 257/98, 257/99, 100
See application file for complete search history.

(56) References Cited

U.S. PATENT DOCUMENTS

2004/0257813 A1* 12/2004 Takezawa ................ 362/267

(Continued)

FOREIGN PATENT DOCUMENTS

JP 62-119987 6/1987

(Continued)

OTHER PUBLICATIONS

U.S. Appl. No. 12/536,538, filed Aug. 6, 2009, Matsumoto, et al.

(Continued)

*Primary Examiner*—Charles D Garber
*Assistant Examiner*—Reema Patel
(74) *Attorney, Agent, or Firm*—Oblon, Spivak, McClelland, Maier & Neustadt, L.L.P.

(57) ABSTRACT

A glass-coated light-emitting element 10 of the invention has a semiconductor light-emitting element 2 having a surface on which no electrode is formed is coated with a glass 1, in which a surface of the glass 1 constitutes a part of a spherical surface broader than a hemispherical surface, the refractive index of the glass 1 at an emission peak wavelength of the semiconductor light-emitting element 2 is 1.7 or more, and the ratio of the diameter of the above-mentioned spherical surface to the maximum diameter of a surface of the semiconductor light-emitting element 2 on which electrodes are formed is 1.8 to 3.5, whereby light emitted from the light-emitting element can be efficiently introduced into a light control unit, and alignment with a lens or a light pipe, which has hitherto been made, becomes unnecessary.

13 Claims, 15 Drawing Sheets

U.S. PATENT DOCUMENTS

| | | | |
|---|---|---|---|
| 2005/0087866 A1* | 4/2005 | Shei et al. | 257/738 |
| 2006/0091411 A1* | 5/2006 | Ouderkirk et al. | 257/98 |
| 2006/0186425 A1* | 8/2006 | Yano et al. | 257/98 |
| 2006/0231737 A1 | 10/2006 | Matsumoto et al. | |
| 2008/0136326 A1 | 6/2008 | Nakamura et al. | |
| 2009/0059591 A1 | 3/2009 | Nakamura et al. | |
| 2009/0072265 A1 | 3/2009 | Nakamura et al. | |

FOREIGN PATENT DOCUMENTS

| | | |
|---|---|---|
| JP | 11-8414 | 1/1999 |
| JP | 2002-176200 | 6/2002 |
| JP | 2002-305328 | 10/2002 |
| JP | 2003-17756 | 1/2003 |
| JP | 2006-156668 | 6/2006 |

OTHER PUBLICATIONS

U.S. Appl. No. 12/817,323, filed Jun. 17, 2010, Matsumoto, et al.

* cited by examiner

GLASS-COATED LIGHT-EMITTING ELEMENT, LIGHT-EMITTING ELEMENT-ATTACHED WIRING BOARD, METHOD FOR PRODUCING LIGHT-EMITTING ELEMENT-ATTACHED WIRING BOARD, LIGHTING DEVICE AND PROJECTOR

CLAIM OF PRIORITY

This application claims priority to Japanese Patent Application No. 2006-274017, filed on Oct. 5, 2006, Japanese Patent Application No. 2006-301558, filed on Nov. 7, 2006, Japanese Patent Application No. 2007-110331, filed on Apr. 19, 2007, and International Application No. PCT/JP2007/069623, filed on Oct. 5, 2007. Each of these applications is incorporated herein in its entirety by reference.

TECHNICAL FIELD

The present invention relates to a semiconductor light-emitting element coated with glass, a lighting device and a projector.

BACKGROUND ART

Semiconductor light-emitting elements represented by light-emitting diodes (LEDs) have characteristics of small size, high efficiency and long life, and have been used in various applications.

For example, when the LED is used as a projector light source, a lighting system can be made compact because of its small size. On the other hand, it is necessary to efficiently introduce outgoing light into a light control unit such as a liquid crystal panel or a micromirror array, because the outgoing light from the LED is non-directional.

In order to efficiently introduce such outgoing light into the light control unit, there have hitherto been used lens-attached light-emitting elements, namely, light emitting elements such as LEDs with various separately prepared lenses which are aligned and fixed to positions thereof through holders of metal or the like so as to have a radiation angle and intensity distribution well adapted for the purpose.

However, such a conventional lens-attached light-emitting element comprises a set of three parts, a light-emitting element, a lens and a holder therefor, and a process for adjusting and fixing those parts is also necessary, resulting in high cost.

Further, there is also a problem that the radiation intensity distribution does not necessarily become efficient when the lens having a normal shape is used.

In order to solve such problems, a lighting system using a light pipe has been proposed (see Patent Document 1).

In such a lighting system, the radiation intensity distribution is considered to become efficient, compared to the case where the above-mentioned lens-attached light-emitting element is used. However, since alignment of the light pipe with the light-emitting element or the light control unit is also necessary, the resolution of the above-mentioned problems has been insufficient.

Patent Document 1: JP-T-2006-505830

DISCLOSURE OF THE INVENTION

Problems that the Invention is to Solve

An object of the invention is to provide a glass-coated light-emitting element which can efficiently introduce outgoing light from a semiconductor light-emitting element into the above-mentioned light control unit and requiring no alignment of a lens or a light pipe with the light-emitting element as described above.

Means for Solving the Problems

The invention provides a glass-coated light-emitting element (first light-emitting element) comprising a semiconductor light-emitting element having a surface on which no electrode is formed is coated with a glass, wherein a surface of the glass constitutes a part of a spherical surface broader than a hemispherical surface, the refractive index of the glass at an emission peak wavelength of the semiconductor light-emitting element is 1.7 or more, and the ratio of the diameter of the above-mentioned spherical surface to the maximum diameter of a surface of the semiconductor light-emitting element on which electrodes are formed is 1.8 to 3.5.

Further, the invention provides a glass-coated light-emitting element (second light-emitting element) comprising a semiconductor light-emitting element having a surface on which no electrode is formed is coated with a glass, wherein the glass is disposed so that its surface constitutes a part of a spherical surface broader than a hemispherical surface, by a process comprising: placing the glass having a refractive index of 1.7 or more at an emission peak wavelength of the semiconductor light-emitting element on an upper surface of the semiconductor light-emitting element on which no electrode is formed; and rising temperature to soften the glass, thereby coating the semiconductor light-emitting element, followed by cooling, and a ratio of a diameter of the spherical surface to a maximum diameter of a surface of the semiconductor light-emitting element on which electrodes are formed is 1.8 to 3.5.

Furthermore, the invention provides a glass-coated light-emitting element (third light-emitting element) which is the first or second light-emitting element in which the semiconductor light-emitting element has a rectangular light-emitting portion.

In addition, the invention provides a glass-coated light-emitting element which is the third light-emitting element in which the distance between a rotationally-symmetric axis of the above-mentioned glass and a rotationally-symmetric axis of the rectangular light-emitting portion is 30 μm or less.

Moreover, the invention provide a light-emitting element-attached wiring board in which a wiring pattern formed on a surface of a wiring board and electrodes of the above-mentioned glass-coated light-emitting element are electrically connected to each other with a bump. Further, the invention provides a method for producing the above-mentioned light-emitting element-attached wiring board comprising electrically connecting electrodes of the semiconductor light-emitting element to a wiring pattern of the above-mentioned wiring board with a bump, placing the above-mentioned glass having a refractive index of 1.7 or more on an upper surface of the semiconductor light-emitting element on which no electrode is formed, rising temperature to soften the glass in such a manner that the glass does not contact with the above-mentioned wiring board or the wiring pattern thereof, thereby coating the semiconductor light-emitting element, followed by cooling to allow a surface of the glass to constitute a part of a spherical surface broader than a hemispherical surface.

Further, the invention provides a lighting device in which a field lens is disposed in front of the above-mentioned glass-coated light-emitting element.

Furthermore, the invention provides a lighting device in which an objective lens is disposed in front of the above-mentioned glass-coated light-emitting element.

In addition, the invention provides a lighting device in which a field lens or an objective lens is disposed in front of the glass-coated light-emitting element of the above-mentioned light-emitting element-attached wiring board.

Advantages of the Invention

According to the invention, since the coating glass has a function similar to that of the above-mentioned lens or light pipe, the alignment as described above becomes unnecessary. Namely, conventionally, when directivity is increased by using a lens, a semiconductor light-emitting element (hereinafter also briefly referred to as a light-emitting element) and the lens has been required to be separately disposed. Accordingly, the alignment thereof has been necessary. However, in the invention, such alignment becomes unnecessary.

Further, in the case where there is a space between the light-emitting element and the lens, when outgoing light goes out from the light-emitting element to the space and enters from the space to the lens, a certain rate thereof reflects. Since the refractive index of the light-emitting element is high in many cases, the amount of utilizable light decreases due to these reflections in such a case. Compared to this, in the invention, there is no space between the glass having a lens function and the light-emitting element. Accordingly, such a problem does not occur.

Furthermore, when a coating of the light-emitting element has a well-known bullet shape, a part of light which enters a portion corresponding to a cylindrical portion of the bullet from the light-emitting element is refracted at a surface of the coating to outgo to an external space, resulting in failure to reach a portion corresponding to a hemispherical surface portion of the bullet. Compared to this, in the invention, since light directly enters the spherical glass from the light-emitting element, much of the light which enters a lower hemispherical portion of the spherical glass corresponding to the cylindrical portion of the bullet returns to an electrode surface again by total reflection, and a light path thereof is changed by scattering at that place, whereby the light reaches an upper hemispherical portion of the spherical glass. Thus, the amount of utilizable light can be increased.

In addition, when the light-emitting element having the rectangular light-emitting portion is used in an image projection apparatus such as a TV or a projector, the light-emitting portion has the same shape as that of matter to be projected. Accordingly, lighting efficiency is improved. Further, application thereof to the projector causes an advantage that a LCD (liquid crystal display) becomes unnecessary.

Figure 1:
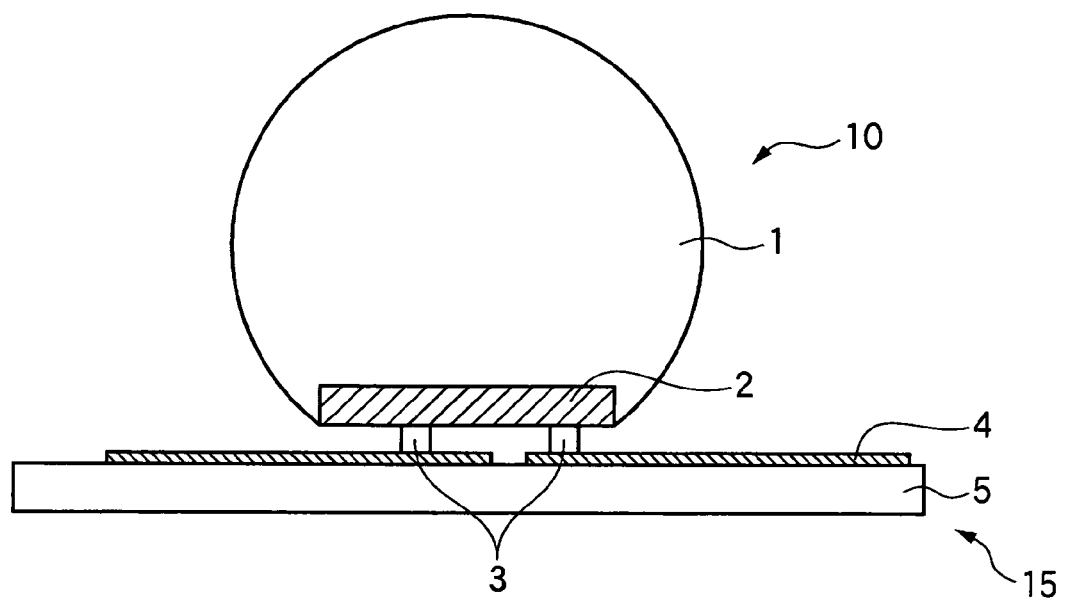
FIG. 1 is a cross-sectional schematic view showing a glass-coated light-emitting element and a light-emitting element-attached wiring board of the invention.

| Description of Reference Numerals and Signs | |
|---|---|
| 1 | Spherical Glass |
| 2 | Semiconductor Light-Emitting Element |
| 3 | Bump |
| 4 | Wiring Pattern |
| 5 | Board |
| 10 | Glass-Coated Light-Emitting Element |
| 10R, 10G, 10B | Glass-Coated Light-Emitting Devices |
| 15 | Wiring Board |
| 20 | Field Lens (Objective Lens) |
| 30R, 30G, 30B | LCDs (Liquid Crystal Displays) |
| 40 | Multiplexer |
| 50 | Projection Lens |
| 60 | Lighting Device |
| 70 | Projector |
| Z | Light Axis |

BEST MODE FOR CARRYING OUT THE INVENTION

The glass-coated light-emitting element and light-emitting element-attached wiring board of the invention will be described below with reference to FIG. 1, but the invention is not limited to FIG. 1.

The reference numeral 2 indicates a light-emitting element, and electrodes (not shown) are formed on a lower surface thereof. As the light-emitting element 2, a LED or a laser diode may be mentioned, and a blue LED is typical. The light-emitting element 2 is generally rectangular or square, seen from above. Accordingly, the surface of a glass-coated light-emitting element 10 on which the electrodes are formed is also generally rectangular or square. When the light-emitting element 2 is rectangular or square, the maximum diameter L thereof is the diagonal length, and L is typically 400 to 1,500 μm.

Figure 11:
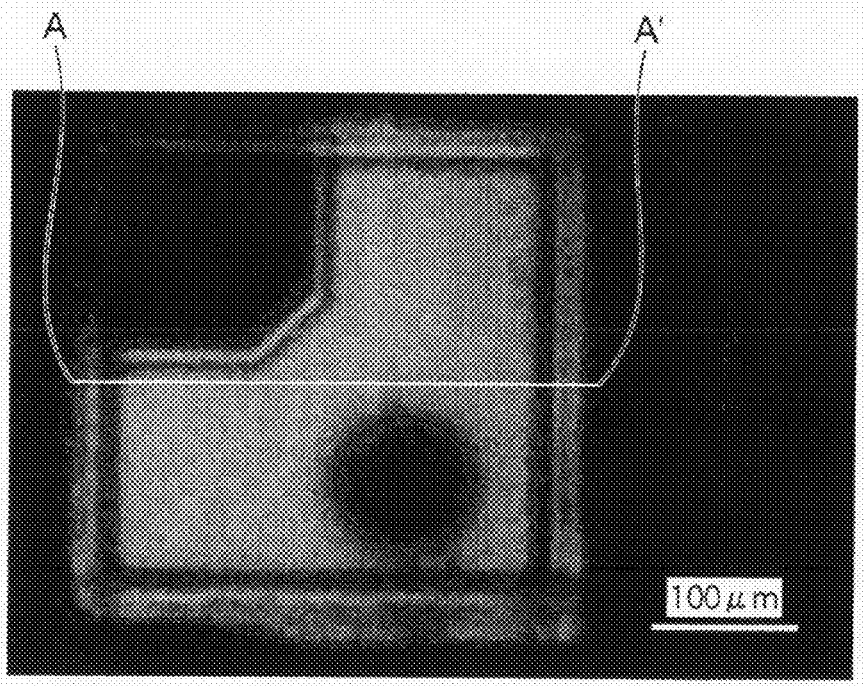
FIG. 11 is a microscopic image of a light-emitting element not coated with glass in a light-emitting state.

The electrode which is a light-emitting surface of the light-emitting element 2 is not limited, and has, for example, an L shape (see FIG. 11). However, in the third light-emitting element, it is rectangular (rectangular or square).

The reference numeral 1 indicates a glass for coating the light-emitting element 2 (this glass is hereinafter referred to as a spherical glass). A surface of the spherical glass 1 constitutes a part of a spherical surface broader than a hemispherical surface. When it is not so, it becomes difficult to improve both directivity and uniformity of the outgoing light. The spherical glass 1 has a shape in which a sphere is cut with a surface of the light-emitting element 2, and a portion at which the sphere is cut is called a spherical segment.

The refractive index $n_p$ of the spherical glass 1 at the emission peak wavelength $\lambda_p$ of the light-emitting element 2 is 1.7 or more. When the refractive index $n_p$ is less than 1.7, this results in a decrease in maximum illuminance or illuminance distribution described later. It is preferably 1.8 or more, and more preferably 1.9 or more. Further, $n_p$ is typically 2.3 or less, or 2.2 or less. Incidentally, $\lambda_p$ is generally 450 to 480 nm, and particularly 450 to 460 nm, in the blue LED.

When the light-emitting element 2 is the light-emitting diode, as the spherical glass 1, for example, a glass essentially comprising 40 to 53% of $TeO_2$, 0 to 10% of $GeO_2$, 5 to 30% of $B_2O_3$, 0 to 10% of $Ga_2O_3$, 0 to 10% of $Bi_2O_3$, 3 to 20% of ZnO, 0 to 3% of $Y_2O_3$, 0 to 3% of $La_2O_3$, 0 to 7% of $Gd_2O_3$ and 0 to 5% of $Ta_2O_5$, in terms of mol % on the basis of oxides, may be used. This glass may contain a component other than the above-mentioned components within the range not impairing the object of the invention. In that case, the total content of such components is preferably 10% or less, and more preferably 5% or less. For example, the terminology "0 to 10% of $GeO_2$" used herein means that $GeO_2$ is not essential, but may be contained in an amount of up to 10%.

Taking the diameter of the above-mentioned spherical surface as d, d/L is adjusted to 1.8 to 3.5. This will be described below. Incidentally, d is equal to the maximum value of the width of the spherical glass 1 in a horizontal direction.

Using as a light source the light-emitting element coated with the spherical glass, the present inventors performed calculation of radiation intensity distribution by ray trace of the outgoing light thereof. Namely, a light-receiving surface is disposed in front of the light source, namely on the outgoing light side, and illuminance on the light-receiving surface was calculated. The outgoing light from the light-emitting element is taken as to be non-directional and non-coherent in all 180-degree directions in a space on the outgoing light side, and the refraction and reflection of the outgoing light was calculated according to the law of refraction and reflection (Snell's law). Further, the calculation was performed by normalizing the total intensity of the light source to 1 mW, and taking the number of outgoing light rays as 1,000,000 rays in total. Incidentally, the calculation was only performed by normalizing the total intensity of the light source to 1 mW for the sake of convenience, and the invention is not limited thereto. Furthermore, in the invention, polarization is not considered, and a decrease in light intensity due to multipath reflection is assumed to be effective until 0.0001%.

There was calculated the illuminance on the light-receiving surface at the time when L was 1 mm, the light-receiving surface was square with each side 15 mm long, and the distance between a point most apart from the light-receiving surface of the spherical surface a part of which was constituted by the spherical glass and the light-receiving surface was adjusted to 19 mm, for the cases where $n_p$ was 1.5, 1.75, 2.0 and 2.25 and d was 1 mm, 2 mm, 3 mm and 4 mm, namely, for the cases where d/L was 1 (the case where the spherical glass was a hemisphere), 2, 3 and 4.

Figure 2A:
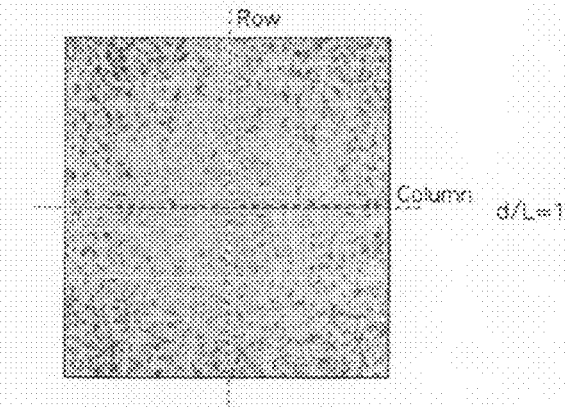
FIGS. 2A to 2D are views showing calculation results (projected shape) in the case where the refractive index of a spherical glass is 1.5.
Figure 2B:
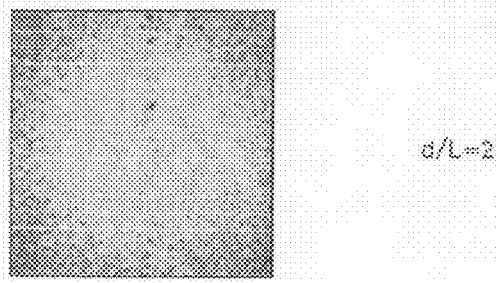
Figure 2C:
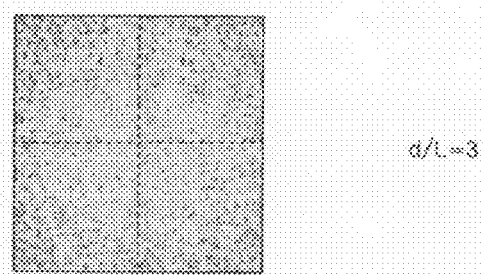
Figure 2D:
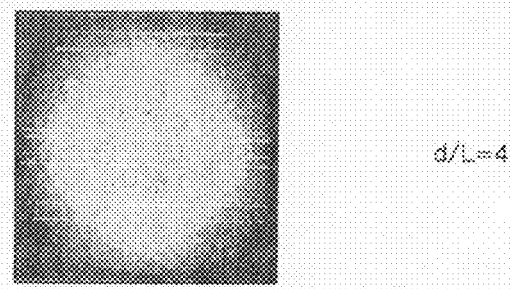
Figure 3A:
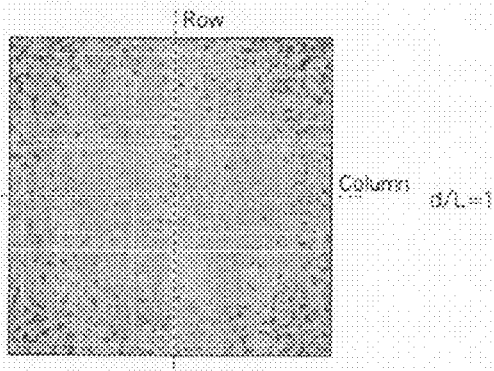
FIGS. 3A to 3D are views showing calculation results (projected shape) in the case where the refractive index of a spherical glass is 2.0.
Figure 3B:
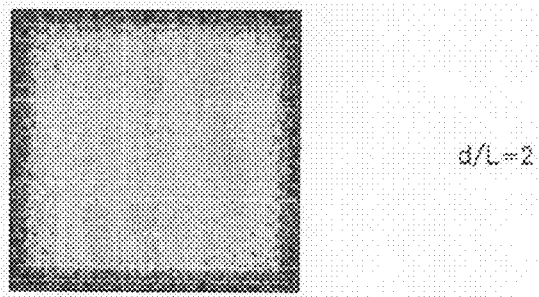
Figure 3C:
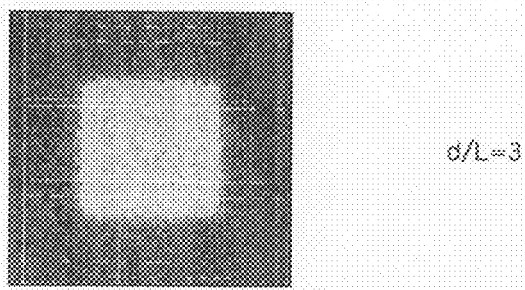
Figure 3D:
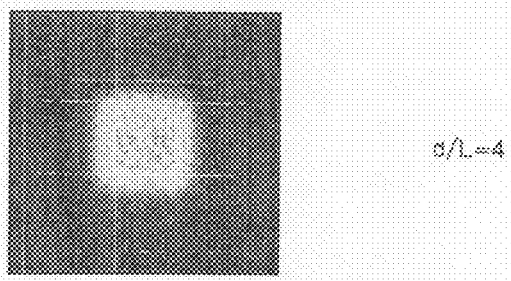
Figure 4A:
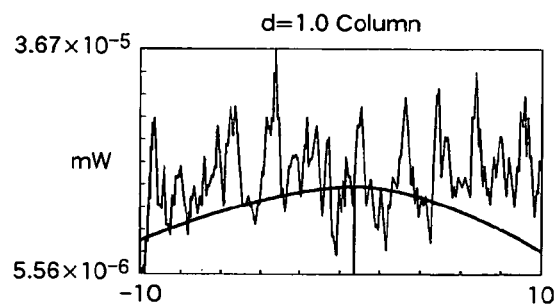
FIGS. 4A to 4D are views showing calculation results (light quantity distribution) in the case where the refractive index of a spherical glass is 1.5.
Figure 4B:
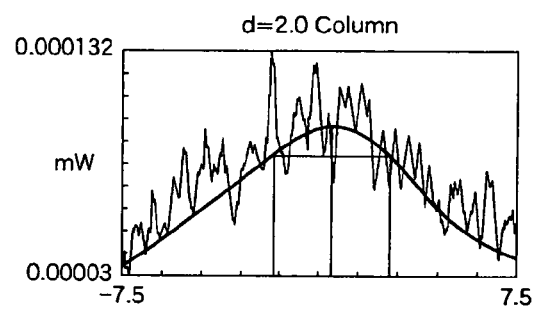
Figure 4C:
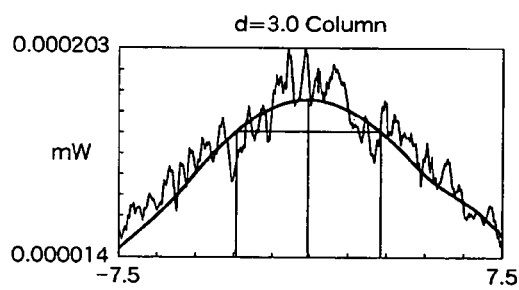
Figure 4D:
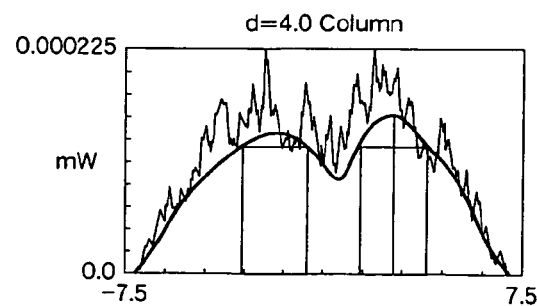
Figure 5A:
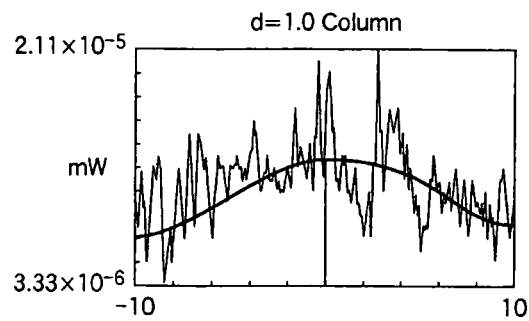
FIGS. 5A to 5D are views showing calculation results (light quantity distribution) in the case where the refractive index of a spherical glass is 2.0.
Figure 5B:
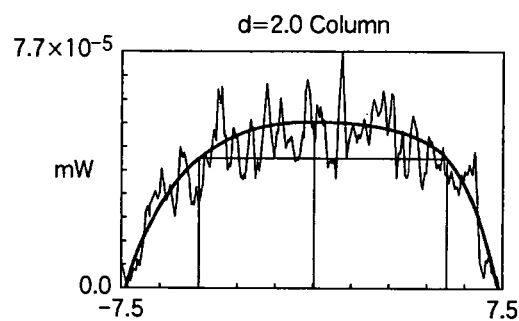
Figure 5C:
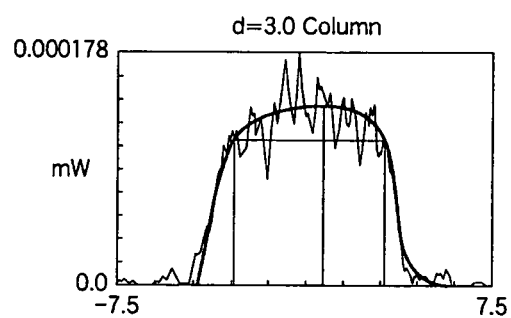
Figure 5D:
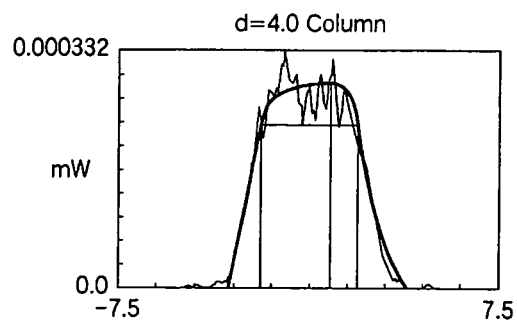

The calculation results in the cases where $n_p$ is 1.5 and d/L is 1, 2, 3 and 4 are shown in FIGS. 2A to 2D, and the calculation results in the cases where $n_p$ is 2.0 and d/L is 1, 2, 3 and 4 are shown in FIGS. 3A to 3D. From these figures, irradiation regions of the light-receiving surfaces in the respective cases can be known. Incidentally, lines indicated by "Row" and "Column" in each of FIGS. 2A and 3A are center lines in a vertical direction and a lateral direction.

From the illuminance obtained by the calculation, the maximum illuminance (unit: mW) and the illuminance distribution (unit: %) was read. The results thereof are shown in Table 1 (maximum illuminance) and Table 2 (illuminance distribution).

Incidentally, the above-mentioned illuminance distribution was read in the following manner. Namely, the lateral length a of an effectively irradiated portion on the light-receiving surface and the lateral length b of a portion having an illuminance of 80% or more of the above-mentioned maximum illuminance were determined, and b/a was taken as the illuminance distribution. The illuminance distribution at d=1 mm could not be read because the effectively irradiated portion became broader than the light-receiving surface.

FIGS. 4A to 4D show light quantity distribution at lateral center lines of FIGS. 2A to 2D, and FIGS. 5A to 5D show light quantity distribution at lateral center lines of FIGS. 3A to 3D, respectively. Base on curves drawn smoothly in the respective figures, the above-mentioned illuminance distribution was read for the cases where $n_p$ was 1.5 and 2.0 and d was 2 mm, 3 mm and 4 mm, namely, for the cases where d/L was 2, 3 and 4. Auxiliary lines for reading are also shown together.

TABLE 1

| d (mm) | $n_p$ = 1.5 | $n_p$ = 1.75 | $n_p$ = 2.0 | $n_p$ = 2.25 |
|---|---|---|---|---|
| 1 | $1.7 \times 10^{-5}$ | $1.4 \times 10^{-5}$ | $1.3 \times 10^{-5}$ | $1.1 \times 10^{-5}$ |
| 2 | $9.9 \times 10^{-5}$ | $7.1 \times 10^{-5}$ | $5.2 \times 10^{-5}$ | $4.5 \times 10^{-5}$ |
| 3 | $1.5 \times 10^{-4}$ | $1.9 \times 10^{-4}$ | $1.3 \times 10^{-4}$ | $1.1 \times 10^{-4}$ |
| 4 | $1.6 \times 10^{-4}$ | $3.9 \times 10^{-4}$ | $2.9 \times 10^{-4}$ | $2.2 \times 10^{-4}$ |

TABLE 2

| d (mm) | $n_p$ = 1.5 | $n_p$ = 1.75 | $n_p$ = 2.0 | $n_p$ = 2.25 |
|---|---|---|---|---|
| 1 | — | — | — | — |
| 2 | 0.29 | 0.54 | 0.68 | 0.50 |
| 3 | 0.34 | 0.48 | 0.71 | 0.77 |
| 4 | 0.34 | 0.31 | 0.62 | 0.70 |

The maximum illuminance is preferably $3 \times 10^{-5}$ or more, and the illuminance distribution is preferably 0.35 or more.

As described above, when $n_p$ is less than 1.7, the maximum illuminance or the illuminance distribution is small.

When the d/L is less than 1.8, the maximum illuminance or the illuminance distribution is small. When it exceeds 3.5, the maximum illuminance or the illuminance distribution decreases in some cases. It is preferably from 2.0 to 3.2.

It is preferred that not only the upper surface of the semiconductor light-emitting element 2 but also side surfaces thereof are coated with the spherical glass 1. When the side surfaces are not coated, there is concern that the utilization efficiency of the outgoing light decreases. Incidentally, a part of the surface of the semiconductor light-emitting element 2 on which the electrodes (not shown) are formed may be coated with the spherical glass 1 as long as the object of the invention is not impaired.

The semiconductor light-emitting element 2 coated with the spherical glass 1 is the glass-coated light-emitting element 10 (first light-emitting element) of the invention.

In FIG. 1, the electrodes of the glass-coated light-emitting element 10, namely, the electrodes (not shown) of the semiconductor light-emitting element 2, are electrically connected to a wiring pattern 4 of a wiring board 15 through a bump 3, and this is the light-emitting element-attached wiring board of the invention. Incidentally, the reference numeral 5 in FIG. 1 indicates a board of the wiring board 15, for example, an alumina board.

In FIG. 1, although the spherical glass 1 is not in contact with the wiring board 15, the invention is not limited thereto. For example, the spherical glass 1 may be in contact with the wiring board 15.

Then, the third light-emitting element of the invention will be supplementarily described below using FIG. 7 and FIG. 8A.

Figure 7:
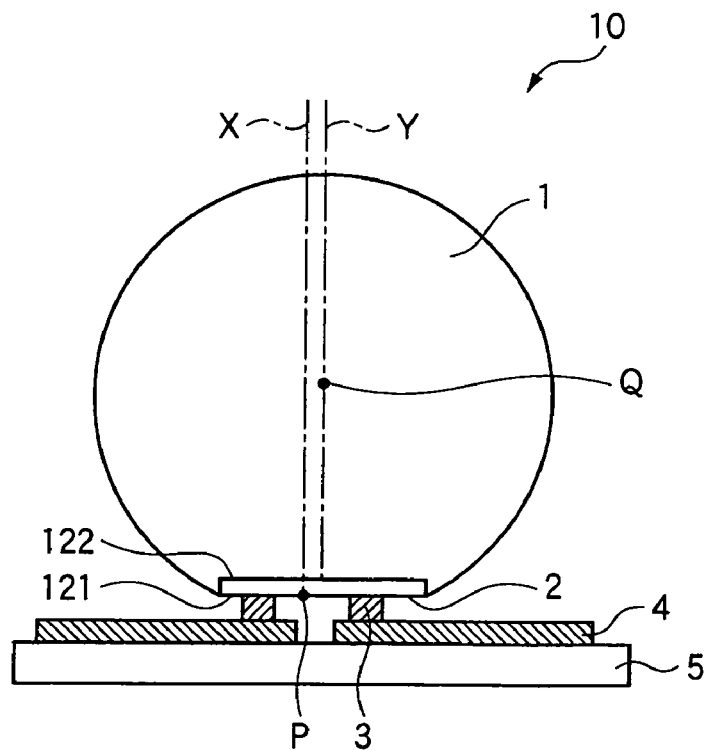
FIG. 7 is a cross-sectional schematic view showing a glass-coated light-emitting element and a light-emitting element-attached wiring board of the invention.
Figure 8A:
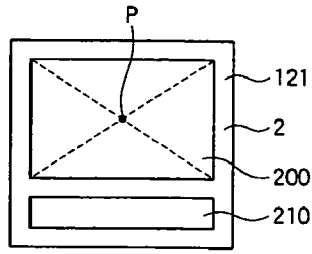
FIGS. 8A and 8B are top views showing a constitution of a semiconductor light-emitting element.

FIG. 7 is a cross-sectional view showing a light-emitting element of the invention similarly to FIG. 1, and FIG. 8A is a top view showing a constitution of a semiconductor light-emitting element 2.

The semiconductor light-emitting element 2 has a main surface 121 on which electrodes are formed and a back surface 122 which is coated with a glass and is opposite to the main surface. The main surface 121 of the semiconductor light-emitting element 2 has a light-emitting rectangular P electrode 200 and a rectangular N electrode 210.

Incidentally, the shape of the light-emitting P electrode 200 is similar to that of a plane of projection projected by the third light-emitting element of the invention. For example, when the aspect ratio of the screen size of the plane of projection projected (a TV screen, a digital camera screen or a projector screen) is 16:9, the aspect ratio of the rectangle is also 16:9.

Here, in the invention, although the P electrode 200 is a light-emitting electrode, it goes without saying that the P electrode and the N electrode may be replace with each other to use the N electrode as a light-emitting electrode.

The bump 3 electrically connects the wiring pattern 4 formed on the board 5 to the semiconductor light-emitting element 2.

Here, the reference sign P described in FIG. 7 and FIG. 8A indicates an intersection of two diagonal lines of the light-emitting rectangular P electrode 200. A straight line X shown in FIG. 7 is a first virtual perpendicular line passing through the intersection P and perpendicular to the main surface 121. The first virtual perpendicular line as used herein is also called a rotationally-symmetric axis of a rectangular light-emitting portion. Incidentally, it goes without saying that the intersection P and the first virtual perpendicular line X are not physically present in an actual product.

The reference sign Q shown in FIG. 7 indicates the center of gravity of the spherical glass 1. Incidentally, when the glass has a complete spherical shape, the center of the gravity of the glass is an intersection of two diameters. However, the center of gravity at the time when it is partially lacking like the glass of the invention is positioned somewhat upper than the center of gravity of a glass having a spherical shape. A straight line Y shown in FIG. 7 is a second virtual perpendicular line passing through the center of gravity Q, perpendicular to the main surface 121, and parallel to the first virtual perpendicular line X. The second virtual perpendicular line Y as used herein is also called a rotationally-symmetric axis of the spherical glass. Incidentally, it goes without saying that the intersection Q and the second virtual perpendicular line Y are not physically present in an actual product.

Figure 8B:
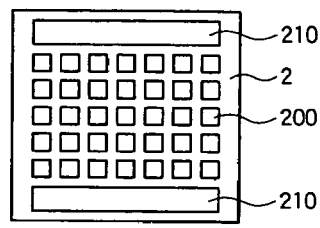

Incidentally, in FIG. 8A, one rectangular P electrode 200 and one rectangular N electrode 210 are disclosed as the semiconductor light-emitting element 2. However, as shown in FIG. 8B, the semiconductor light-emitting element 2 may be constituted by a plurality of rectangular P electrodes 200 and a plurality of rectangular N electrodes 210. By constituting like this, different images can be output from the plurality of rectangular P electrodes 200, respectively. This makes it possible to obtain a matrix description.

Figure 9A:
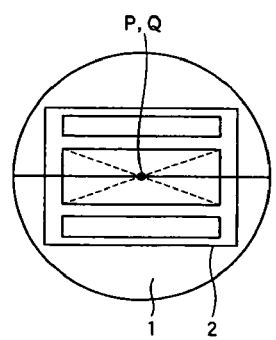
FIGS. 9A and 9B are top views showing the relationship between a rotationally-symmetric axis of a spherical glass and a rotationally-symmetric axis of a light-emitting portion of a semiconductor light-emitting element.
Figure 9B:
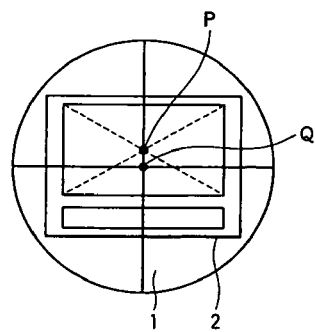

FIG. 9 is a top view showing the relationship between the rotationally-symmetric axis (second virtual perpendicular line) Y of the spherical glass 1 and the rotationally-symmetric axis (first virtual perpendicular line) X of the light-emitting portion of the semiconductor light-emitting element 2. The calculation of radiation intensity distribution described above was performed for the case where the light-emitting portion of the semiconductor light-emitting element was rectangular, and the rotationally-symmetric axis (first virtual perpendicular line) X of the rectangular light-emitting portion and the rotationally-symmetric axis (second virtual perpendicular line) Y of the spherical glass were taken to overlap each other (FIG. 9A). Namely, seen from just above of the spherical glass 1, the intersection P and the center of gravity Q were assumed to be present on the same virtual line. However, it is also conceivable that the rotationally-symmetric axis (first virtual perpendicular line) X of the rectangular light-emitting portion and the rotationally-symmetric axis (second virtual perpendicular line) Y of the spherical glass 1 deviate from each other in some cases (FIG. 9B). According to the results of simulation, there is no influence on the illuminance distribution, when the amount of deviation (the difference in distance) described above is 30 μm or less.

The second light-emitting element, the first light-emitting element and methods for producing the light-emitting element-attached wiring board will be described below using specific examples.

Preparation of Wiring Board

An alumina board having a purity of 99.6% and a thickness of 1 mm was prepared as a board.

Further, gold paste for forming electrodes of a wiring board was prepared in the following manner. Namely, gold powder (80% by mass) and organic varnish (20% by mass) were mixed, and kneaded in a porcelain mortar for 1 hour. Then, dispersion was performed three times by using a three-roll mill to form the gold paste. As the gold powder, there was used spherical fine powder having an average particle size of 2 μm. Further, as the organic varnish, there was used a mixture obtained by mixing an ethyl cellulose resin having a polymerization degree of 7 with α-terpineol at a mass ratio of 9:1.

Then, the above-mentioned gold paste was screen printed on a surface of the above-mentioned alumina board so as to obtain a desired wiring pattern, and heat treated at 120° C. for 10 minutes, followed by burning at 800° C. for 30 minute to obtain a wiring board in which the gold wiring pattern was formed on the alumina board.

Bonding of LED to Wiring Board

A blue LED (trade name: E1C60-0B011-03) manufactured by Toyoda Gosei Co., Ltd. was prepared. This LED has a $\lambda_p$ of 460 nm, and a surface on which electrodes are formed, namely, an electrode surface, is square with each side 320 μm long. Namely, L is 453 μm.

First, two bumps were formed on the electrodes of the LED in total. Specifically, gold bumps were formed by a gold wire (SGH-25 (trade name) manufactured by Sumitomo Metal Mining Co., Ltd.) having a diameter of 25 μm, using a manual wire bonder (trade name: 7700D) manufactured by West Bond Inc. The gold bumps formed had a diameter of 100 μm and a height of 25 μm.

Then, the electrodes on the LED electrode surface were bonded to the gold wiring through these two gold bumps. At this time, the LED was mounted while applying pressure so that the LED became parallel to the alumina board. Specifically, the LED was flip-chip mounted on the alumina board using a flip chip bonder (trade name: MOA-500) manufactured by Hisol Inc. The gold bumps mounted had a diameter of about 100 μm and a height of about 20 to about 30 μm.

LED Coating with Glass

A glass comprising 45.0% of $TeO_2$, 1.0% of $TiO_2$, 5.0% of $GeO_2$, 18% of $B_2O_3$, 6% of $Ga_2O_3$, 3.0% of $Bi_2O_3$, 15% of ZnO, 0.5% of $Y_2O_3$, 0.5% of $La_2O_3$, 3.0% of $Gd_2O_3$ and 3.0% of $Ta_2O_5$, in terms of mol % was prepared. This glass had refractive indexes of 2.01 and 1.98 at wavelengths of 405 nm and 460 nm, respectively.

Then, the above-mentioned glass was processed to a block form having an appropriate size, and thereafter, placed on the above-mentioned flip-chip-mounted LED, namely, on the upper surface of the LED on which no electrode was formed.

After the block-shaped glass was placed on the LED, the temperature was raised from 25° C. to 610° C. at a rate of 5° C./min using an electric furnace (trade name: FP41) manufactured by Yamato Scientific Co., Ltd. to soften the glass. After the LED was coated therewith, it was cooled to 25° C. to obtain a glass-coated light-emitting element (light-emitting element A) in which the upper surface and side surfaces of the LED were coated with a spherical glass (d/L=2.25) having a d of 1.02 mm and a height from a lower surface of the LED of 0.96 mm.

The shape of the spherical glass of the glass-coated light-emitting element thus obtained is formed by surface tension of the glass. Incidentally, since the softened glass is forced to coat the side surfaces of the LED, the softened glass is positioned by the side surfaces. As a result, a central axis of the spherical glass agrees with an axis of the LED (self alignment).

Figure 6:
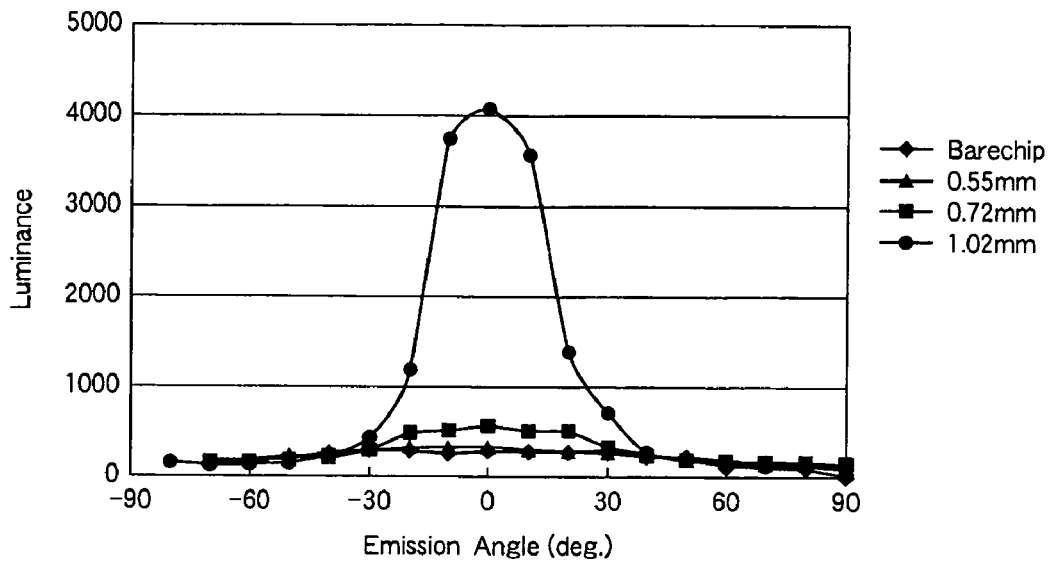
FIG. 6 is a view showing angle dependency of outgoing light of a glass-coated light-emitting element of the invention.

Similarly, glass-coated light-emitting elements having thicknesses of 0.55 mm (d/L=1.21) and 0.72 mm (d/L=1.59) were prepared, respectively. For these three glass-coated light-emitting elements and a bare chip (the above-mentioned LED not glass-coated), angle dependency of outgoing light was measured by using a luminance meter (trade name: BM7) manufactured by Topcon Corporation under conditions of an uptake angle of 1°. The results thereof are shown in FIG. 6 (the emission angle is plotted on the abscissa and the luminance on the ordinate in FIG. 6, and in the descriptions of the respective lines on the right side in FIG. 6, for example, 1.02 mm is a numerical value of d.). This reveals that when d/L exceeds 1.8, the front luminance increase.

Although a glass-coated light-emitting element having a d/L of up to about 2.3 can be prepared by the method as described above, one having a d/L larger than that is preferably prepared, for example, in the following manner. Namely, a mold for receiving weight of the glass is made of boron nitride or carbon having poor wettability to the glass, and it is disposed in the vicinity of the LED. At this time, a surface of the mold which comes into contact with the glass is formed to a spherical surface shape having the same curvature as in the case where the glass becomes spherical.

Further, for the above-mentioned light-emitting element A and the mounted LED not coated with glass (light-emitting element B), light-emitting states, projection images and luminance (illuminance) were measured, and the above-mentioned illuminance distribution was calculated from luminance distribution.

Figure 10:
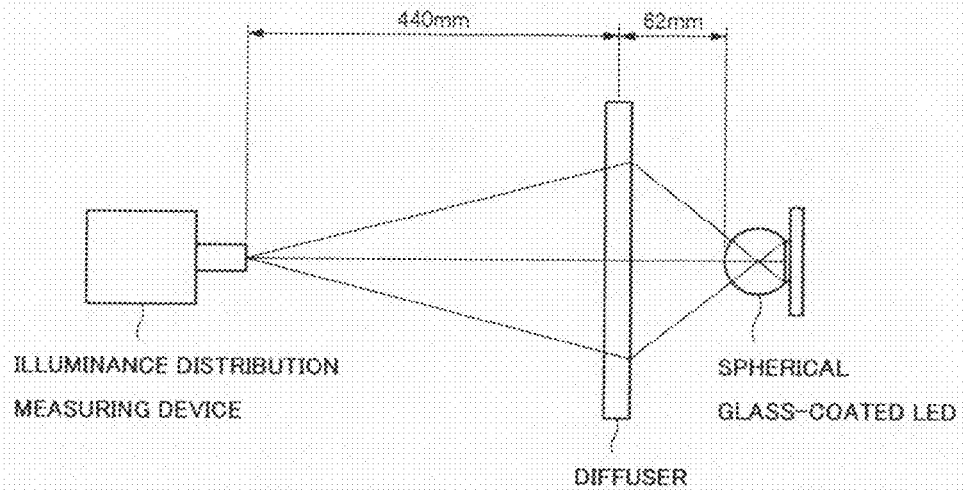
FIG. 10 is a view showing a measuring method of illuminance of a light-emitting element on a diffuser.

An optical system as shown in FIG. 10 was assembled, and the luminance distribution of the light-emitting element A on a diffuser.

In this system of measurement, one side of an LED image projected on the diffuser was about 50 mm in length. The luminance distribution of the mounted LED not coated with glass was incorporated as a light-emitting image through a CCD by means of a microscope to obtain luminance data. A microscopic image of the light-emitting element not coated with glass in a light-emitting state is shown in FIG. 11.

Figure 12:
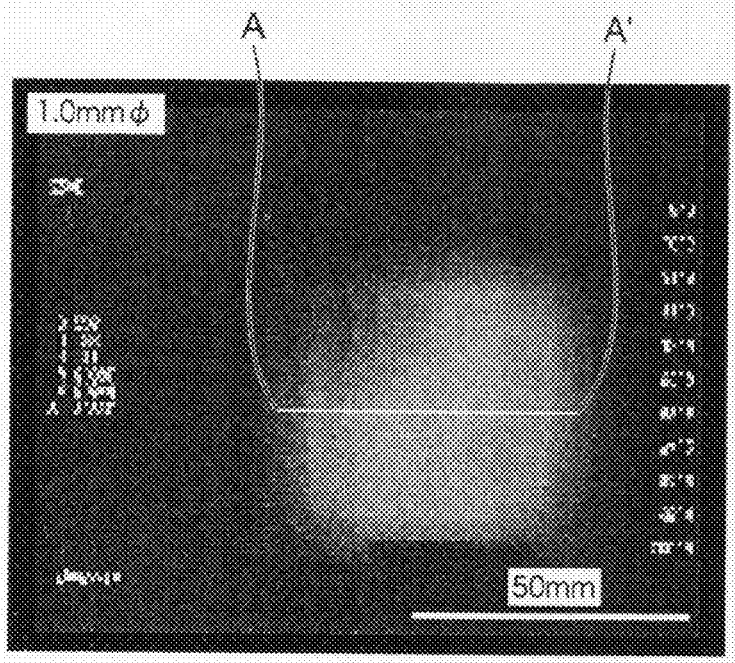
FIG. 12 is a microscopic image of a glass-coated light-emitting element in a light-emitting state.

In FIG. 12, there is shown a light-emitting projected image of the LED coated with the glass (light-emitting element A). Like this, the light outgoing from the LED coated with the spherical glass is collimated by the spherical glass as indicated in FIG. 16 shown later, so that an image can be formed on the diffuser.

Figure 13:
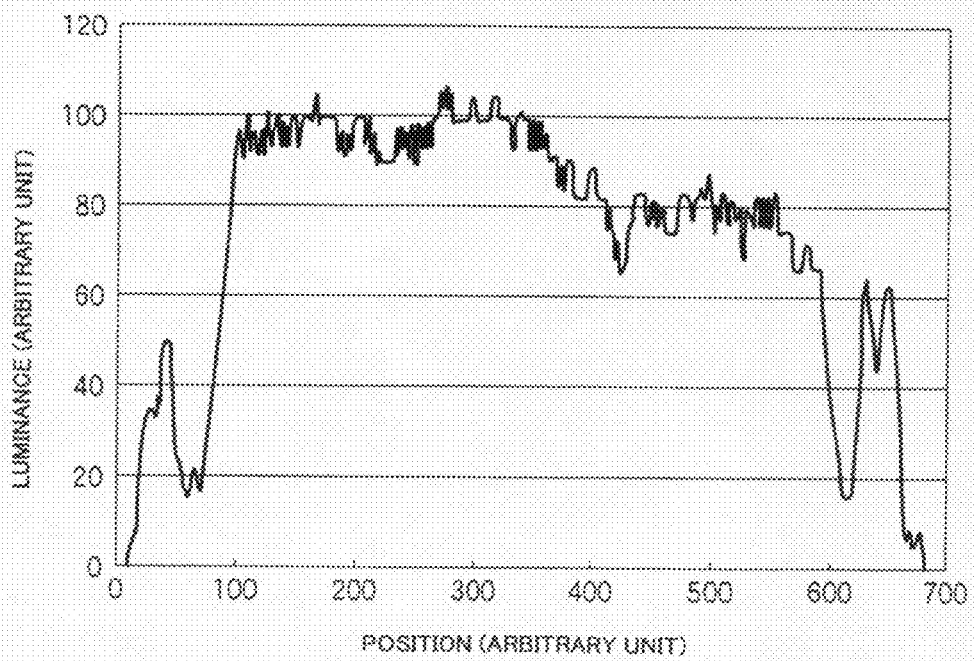
FIG. 13 is a view showing luminance distribution of a light-emitting element not coated with glass.
Figure 14:
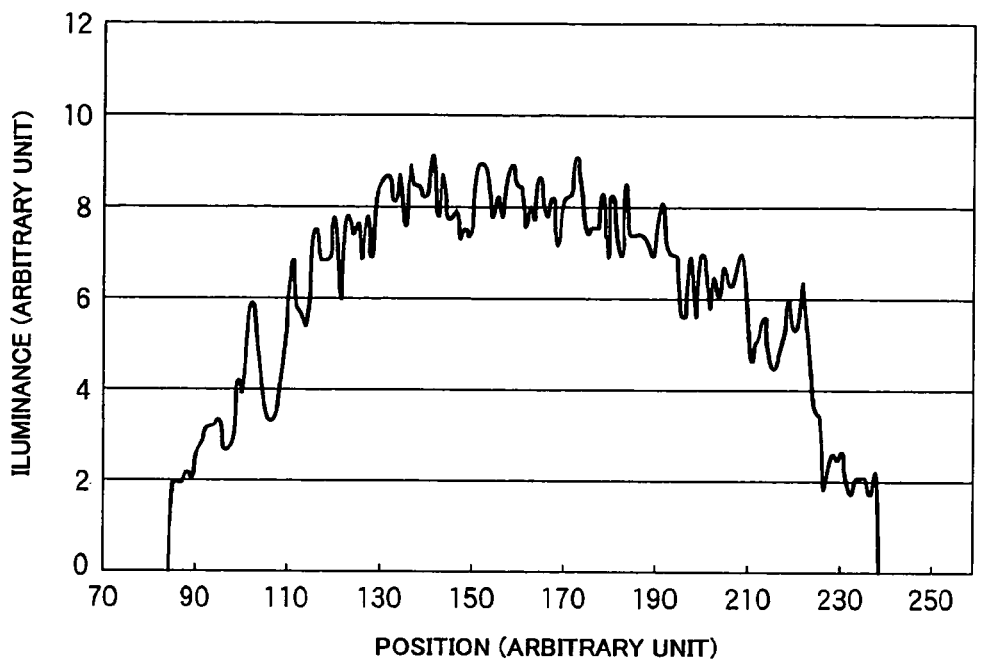
FIG. 14 is a view showing luminance distribution of a glass-coated light-emitting element.

Then, luminance (illuminance) distribution at respective lines A-A' in FIGS. 11 and 12 is shown in FIGS. 13 and 14, respectively.

The luminance distribution of the mounted LED not coated with glass is flat in a left half, but is relatively poor in luminance uniformity and becomes dark in a right half, as seen from FIG. 13. This tendency is also confirmed in FIG. 14.

Figure 15:
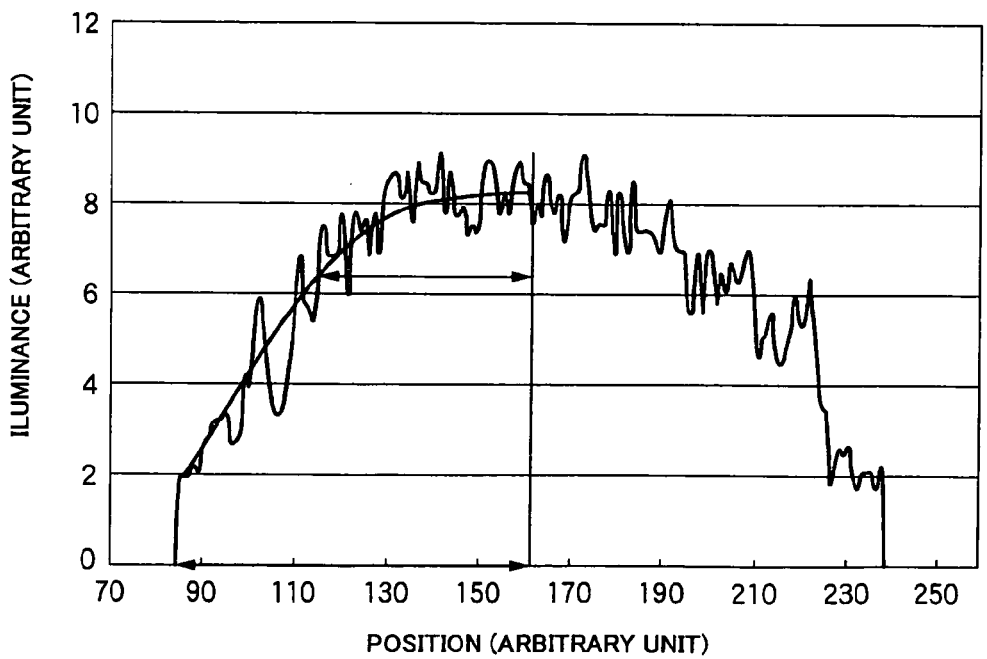
FIG. 15 is a view for illustrating a calculation process of illuminance distribution of a glass-coated light-emitting element.

In order to determine the illuminance distribution of the glass-coated LED, the illuminance was smoothed in a left half in FIG. 14 to calculate a portion having an illuminance of 80% or more of the maximum illuminance. A state at that time is shown in FIG. 15.

The illuminance distribution thus calculated was 62%. This value of 62% was close to 68% which was determined by the calculation for the case of d/L=2 according to the method as described above, and it was confirmed that the above-mentioned calculation was reliable.

Further, light outgoing from the mounted LED not coated with glass was similarly irradiated to the diffuser. However, no image was obtained to result in failure to calculate the illuminance distribution.

Figure 16A:
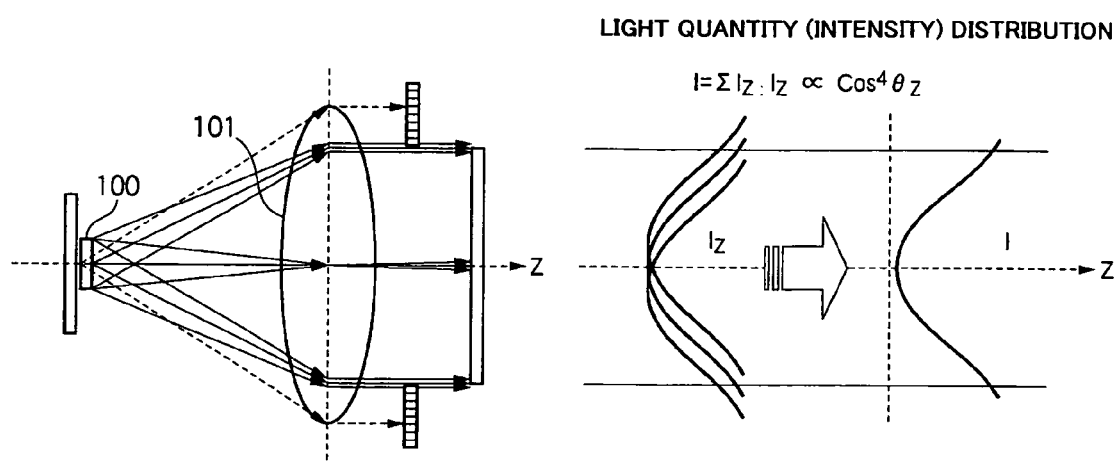
FIG. 16A is a graph showing light quantity distribution at an irradiation light path from a light-emitting element having no directivity to an irradiation surface and at the irradiation surface.

As shown in FIG. 16A, in a light-emitting element 100 having no directivity such as an usual LED, the light intensity I of a light flux converted to parallel light by a collimater 101 becomes normal distribution (Gaussian distribution) showing maximum distribution in a central portion according to a cosine fourth power rule ($COS^4 \theta_z$), as long as there is no optical element (such as a integral lens) for equalizing light quantity distribution (see the data of d=1.02 mm in FIG. 6). $\theta_z$ is an angle between a light ray before entering the collimater 101 and a light axis, Iz is intensity distribution of the whole light ray outgoing from a certain point, passing through a lens and arriving into a face to be lighted, and ΣIz is intensity distribution of the whole light rays outgoing from all points of a light source and arriving into a face to be lighted.

Figure 16B:
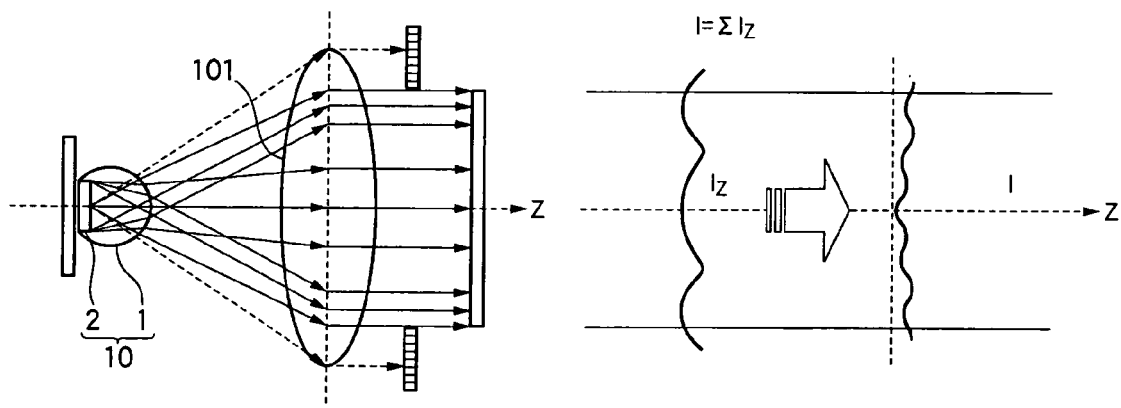
FIG. 16B is a graph showing light quantity distribution at an irradiation light path from a glass-coated light-emitting element of the invention to an irradiation surface and at the irradiation surface.

On the other hand, in the invention, even when the usual LED having light-emitting characteristics of the same normal distribution as the conventional one is used as the light-emitting element 2, the light intensity I of a light flux converted to parallel light by the collimater 101 is approximately averaged in light quantity distribution by constituting by the glass-coated light-emitting element 10 in which the light-emitting element 2 is coated with the spherical glass as shown in FIG. 16B (see the data of Barechip, d=0.55 mm and d=0.72 mm in FIG. 6). This is because in the case of a light source having directivity, even when $\theta_z$ passing through the spherical glass 1 is large, it is converted to a thin light flux having directivity after passing through the spherical glass 1, so that the difference in angle of the light flux passing through the collimater 101 decreases to pass through only a part of the collimater 101 in respective outgoing directions, whereby $\theta_z$ decreased by the cosine fourth power rule becomes small.

The lens function of the spherical glass 1 having a spherical segment shape will be described below.

(a) As for that a part of outgoing light form the light-emitting element 2 is allowed to totally reflect at a side surface of the spherical glass 1:

Light having an emission peak wavelength $\lambda_p$, which outgoes from the light-emitting element 2, for example, blue light of 460 nm, is surface-emitted to a region over an approximately entire circumference, 360 degrees, of a space on the outgoing light side except for a rear portion of the light-emitting element 2, and an irradiation pattern thereof immediately after outgoing thereof (at the time of entering the spherical glass 1) is a mountain shape having a maximum peak at a center thereof, which approximately corresponds to normal distribution, as shown as the line of d=1.02 mm in FIG. 6. This outgoing light from the light-emitting element 2 advances in the inside of the spherical glass 1 immediately after outgoing without passing through the air, and then, only light which has entered at an angle greater than the total reflection angle to an interface with the air when passing through the spherical glass 1 outgoes outside the spherical glass 1. On the other hand, light which has entered at an angle smaller than or equal to the total reflection angle to an interface with the air repeats reflection, and is scattered at electrode surfaces. Of the light scattered, light which has reached the glass-air interface at an angle greater than the total reflection angle outgoes outside.

Figure 17A:
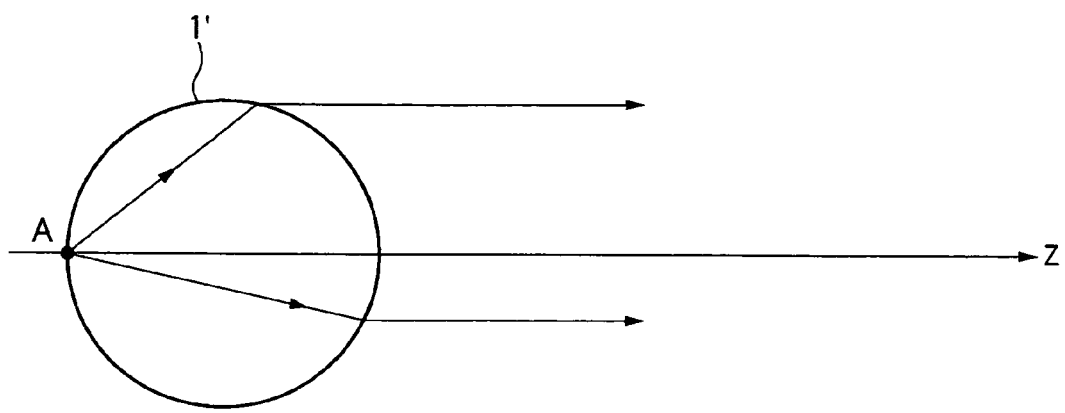
FIG. 17A is an illustrative view showing a light path after outgoing from a spherical lens 4 when a light-emitting point A of a light-emitting element is a backmost point of the spherical lens.
Figure 17B:
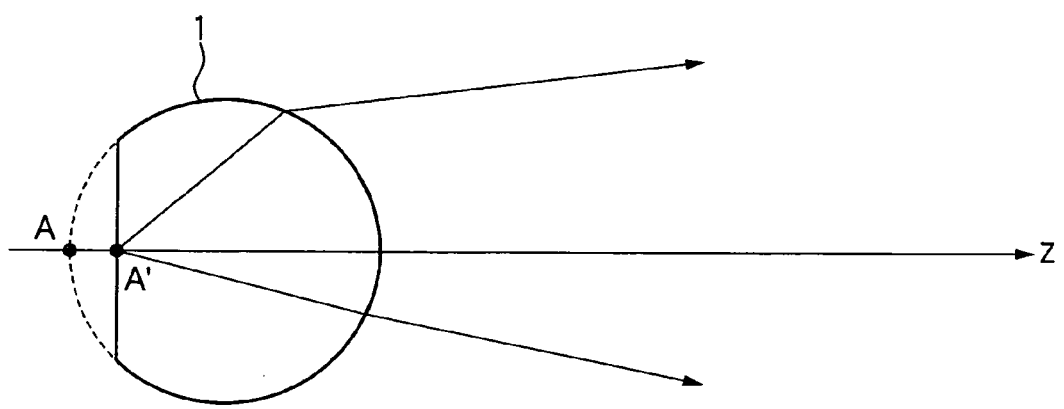
FIG. 17B is an illustrative view showing a light path when the light-emitting point A is deviated from the backmost point of the spherical lens to a front side thereof in an irradiation direction.

(b) As for that when passing through the spherical glass 1, the light flux is spread in a diffusing direction by deviating a light-emitting point A' of the light-emitting element 2 as a light source to a more front side in an irradiation direction than a virtual backmost point A at the time when the spherical glass 1 is assumed to be a perfect sphere:

For example, when it is assumed that such aberration-free paraxial conditions that spherical aberration of a spherical lens 1' having no spherical segment is negligible hold, as shown in FIG. 17A, in the case where the light-emitting point A of the light-emitting element 2 is on a backmost point A of the spherical lens 1', a light flux after outgoing from the spherical lens 1' advances as a parallel light flux. Incidentally, the light ray which is emitted from the light-emitting point A and outgoes from the spherical lens 1' practically converges toward a direction close to a light axis compared to an advancing direction of the light ray in the case of no aberration, because the spherical aberration increases as a position at which the light ray outgoes from the spherical lens 1' is apart from the light axis. On the other hand, in the light-emitting element 2 of the invention, a light-emitting point A' is deviated to a more front side (Z-axis side) in an irradiation direction than the backmost point A of the spherical lens 1' as shown in FIG. 17B, so that an effect of spreading the light flux in a diffusing direction (hereinafter referred to as a first effect) can be given.

(c) As for that when passing through the spherical glass 1, the light flux can be spread in a diffusing direction by adjusting the refractive index n, for example, to 1.7 or more, or that the light flux can be narrowed in a converging direction by adjusting the refractive index n, for example, to 2.2 or less:

In general, when in a cross section including a light axis passing through a center of a double-sided spherical lens, the lens surface radii are taken as $r_1$ and $r_2$, respectively, the refractive index of the spherical lens as n, and the lens thickness in a light axis direction as t, the refractive power (1/f, wherein f is the focal distance) is represented by equation (1).

$$1/f=[(n-1)/r_1]+[(1-n)/r_2]+[\{(n-1)^2 d\}/(n \cdot r_1 \cdot r_2)] \qquad (1)$$

In the spherical lens, $r_1 = -r_2 = d/2$.

For one having a shape in which a sphere is partially cut away by a plane, namely, a spherical segment shape, such as the spherical glass 1, when the radius of a hemisphere on the side on which the sphere is partially cut away is taken as $r_1$ herein for the sake of convenience, $r_1$ becomes ∞ to result in $1/r_1 \to 0$. Accordingly, equation (1) becomes the following equation (2):

$$r_2=(1-n) \cdot f \qquad (2)$$

Then, in the ideal case of sufficiently satisfying paraxial conditions, when n is 2, equation (2) becomes $r_2 = -f$. Namely, the focal distance becomes equal to $r_2$. When an object point is placed in a place of $r_2$ from the center of the lens, outgoing light becomes parallel light.

Accordingly, in such an ideal case, an effect of diffusing the light flux when the refractive index of the spherical glass 1 is less than 2 and converging the light flux when it exceeds 2 (hereinafter referred to as a second effect) can be given.

Figure 18:
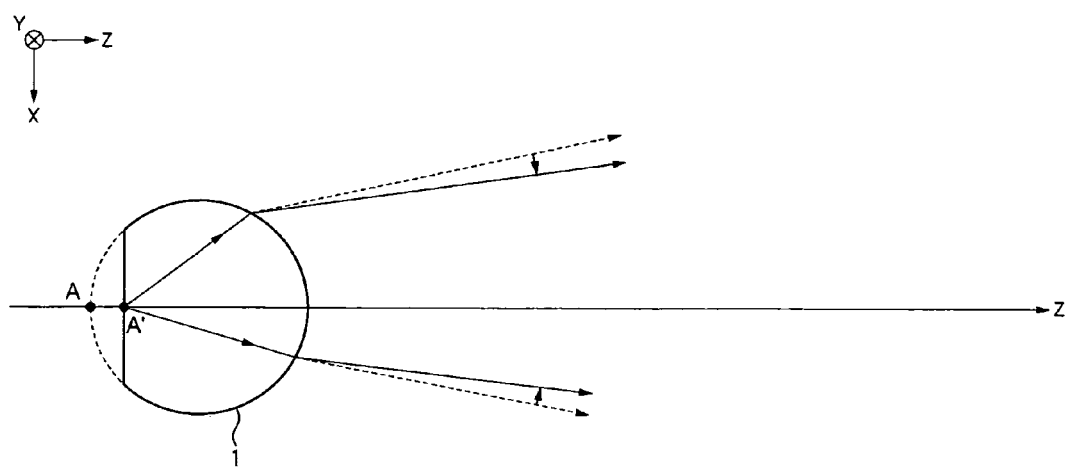
FIG. 18 is an illustrative view showing deviation of a light path due to spherical aberration in a glass-coated light-emitting element of the invention.

(d) As for that when passing through the spherical glass 1, such a function in a converging direction as to cancel (adjust) the effects in above-mentioned (b) and (c) is generated by spherical aberration of the spherical glass 1:

As is commonly known, except for such an ideal case as to sufficiently satisfying paraxial conditions, a function is generated that light which advances from an object point on a light axis (Z) generally focuses into an image nearer than an ideal focus position as the light is from the object point apart from the light axis (Z) with respect to a direction (X) perpendicular to the light axis (Z), as shown in FIG. 18 (spherical aberration).

Then, in the invention, in order to cancel a combined value of the above-mentioned first and second effects by this function, the d/L and refractive index $n_p$ of the spherical glass 1 are set to proper values, respectively.

Namely, in the invention, in order to specifically realize this, a) the light-emitting point A' of the light-emitting element 2 is deviated to the more front side in the irradiation direction than the backmost point A of the spherical glass 1, and b) as the spherical glass, there is used one having a refractive index $n_p$ of 1.7 or more, preferably 1.8 to 2.2, and typically 1.9 to 2.2.

The lighting device of the invention will be described below with reference to FIG. 19.

The lighting device 60 of the invention comprises a glass-coated light-emitting element 10 and a field lens (objective lens) 20. In the glass-coated light-emitting element 10, electrodes thereof are usually electrically connected to a wiring pattern of a wiring board with a bump.

According to the lighting device 60 of the invention, respective light rays outgoing from the glass-coated light-emitting element 10 advance as a light flux having a certain similar directivity in a direction along a main light axis determined by a position of a light-emitting point of the LED and a center point of the glass-coated light-emitting element 10, and reach the field lens 20. Then, each light flux which has reached the field lens 20 is further deviated at a height of a reaching point of the field lens 20 in a direction approaching in parallel to the light axis of the lens by refractive force, and reaches a body to be lighted (not shown).

When the spherical lens of the glass-coated light-emitting element 10 and the field lens 20 are ideal aplanatic lenses herein, the light rays in all directions also become possible to perpendicularly enter the body to be lighted. However, practically, either of the lenses has large spherical aberration, so that the presence of light rays which obliquely enters the body to be lighted is unavoidable to some extent.

Figure 19A:
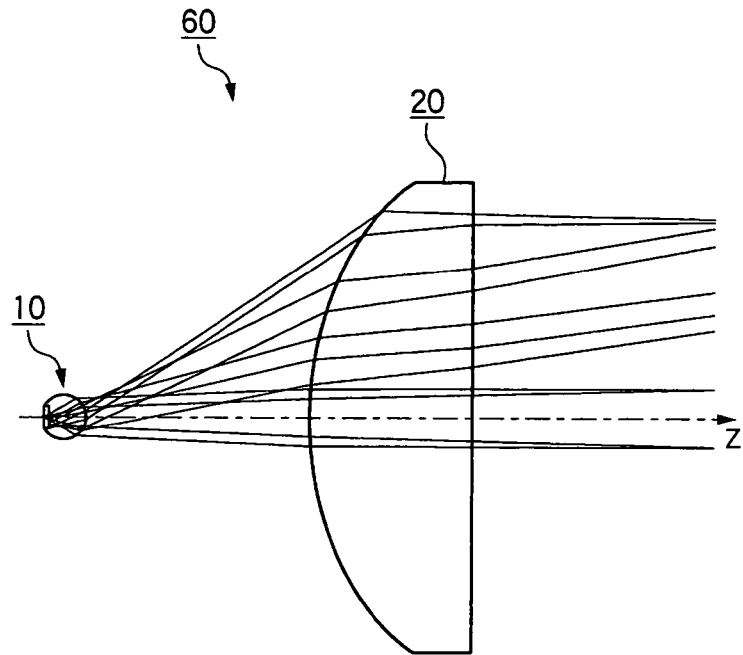
FIGS. 19A and 19B are a constitutional view and a front view showing a lighting device of the invention, respectively.
Figure 19B:
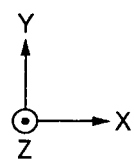
Figure 19B:
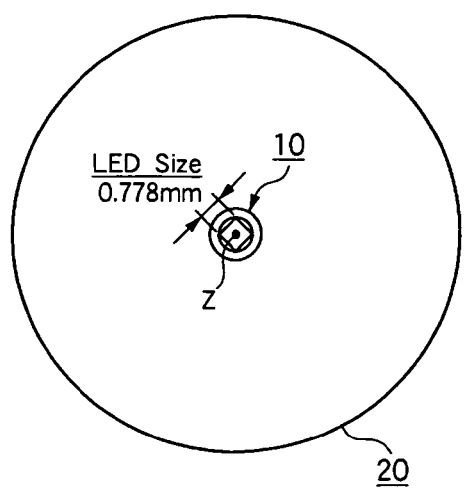

However, the light rays outgoing from the glass-coated light-emitting element 10 can be allowed to almost enter a surface of the body to be lighted, as perpendicularly as possible within the range of its aberration by optimizing the refractive force and position of the field lens 20 so that the light fluxes at a center and in the vicinity of a periphery almost enter the surface of the body to be lighted as shown in FIG. 19, observing a state of variation of the light rays in the spherical lens and the field lens 20. Then, the position of the light ray entering the body to be lighted determined corresponding to the position of the light-emitting point of the glass-coated light-emitting element 10, so that when the light ray intensity of the glass-coated light-emitting element 10 is uniform, the intensity of the light ray reaching each point of the body to be lighted also become nearly uniform. Accordingly, for example, in the fields of general architectural lighting members and displays such as liquid crystal television screens and projector screens, an irradiation surface or a screen having relatively uniform light ray intensity can be realized without using an expensive additional optical system such as an expensive equalizing optical system such as a conventional integrator lens, even when necessary, only adding an inexpensive equalizing element such as a thin diffuser.

Figure 20:
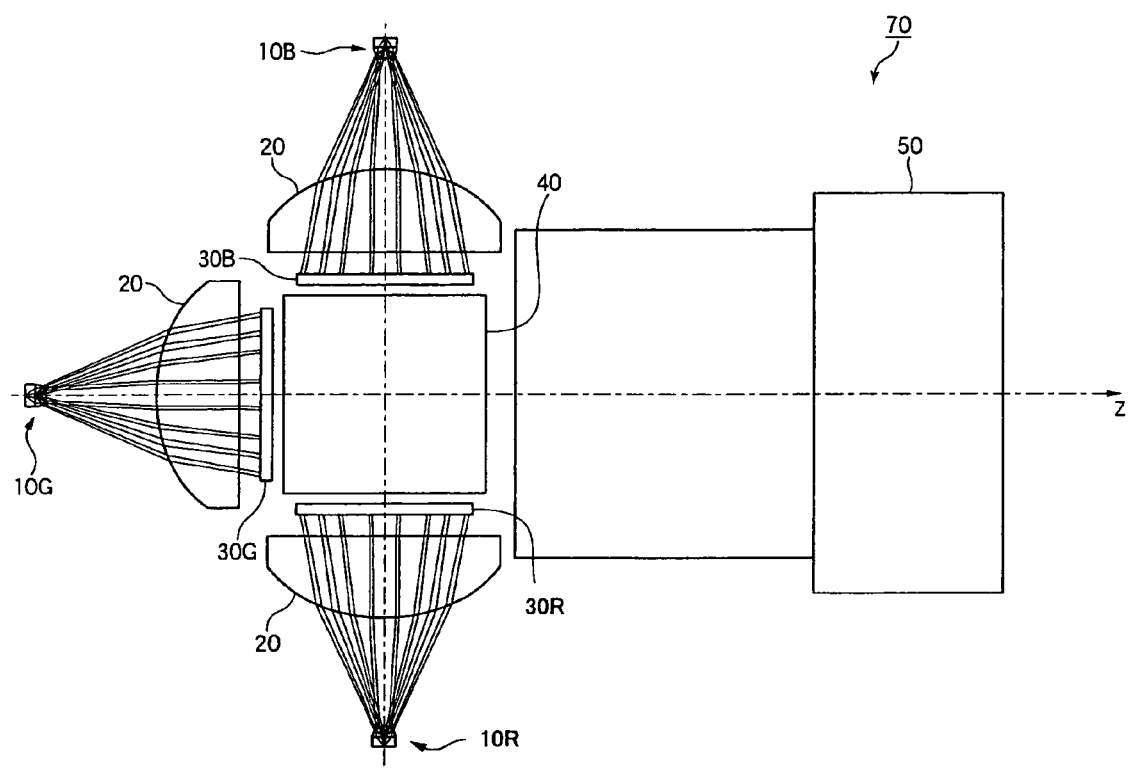
FIG. 20 is a constitutional view showing a projector of the invention.

The projector device of the invention (herein after briefly referred to as the projector) will be described below with reference to FIG. 17 and FIG. 20, but the invention is not limited to one as shown in FIG. 20.

The projector 70 of the invention comprises glass-coated light-emitting elements 10R, 10G and 10B of the invention, a field lens 20, LCDs (liquid crystal displays) 30R, 30G and 30B, a multiplexer 40 and a projection lens 50. Incidentally, in the glass-coated light-emitting elements 10R, 10G and 10B, electrodes thereof are each usually electrically connected to a wiring pattern of a wiring board with a bump.

According to the projector 70 having such constitution, each light from the glass-coated light-emitting elements 10R, 10G and 10B mounted as respective light sources of R, G and B passes through the field lenses 20, and then, enters the LCDs (liquid crystal displays) 30R, 30G and 30B from back faces thereof to form backlights. Then, after images corresponding to respective light components of R, G and B have been formed in the LCDs (liquid crystal displays) 30R, 30G and 30B, image components thereof are multiplexed in the multiplexer 40, followed by entering the projection lens.

According to the projector 70 of the invention, an optical engine unit for uniformly lighting the respective LCDs for the three primary colors can be constituted only by the light-emitting elements 10R, 10G and 10B and the three field lenses 20 without using an equalizing optical system such as a conventional complicated integrator lens having a certain size. Accordingly, the number of parts of a conventional three-LCD projector optical system can be substantially reduced, and it becomes possible to produce the system in small size and at low cost.

Incidentally, when the glass-coated light-emitting elements 10R, 10G and 10B are the third light-emitting element of the invention, it becomes possible not to use the LCDs 30R, 30G and 30B.

While the invention has been described in detail with reference to specific embodiments thereof, it will be apparent to one skilled in the art that various changes and modifications can be made therein without departing from the spirit and scope of the invention.

The present application is based on Japanese Patent Application No. 2006-274017 filed on Oct. 5, 2006, Japanese Patent Application No. 2006-301558 filed on Nov. 7, 2006 and Japanese Patent Application No. 2007-110331 filed on Apr. 19, 2007, the contents of which are incorporated herein by reference.

INDUSTRIAL APPLICABILITY

The glass-coated light-emitting element of the invention has advantages that it has excellent irradiation efficiency, that emitted light can be efficiently introduced in a desired direction, and that alignment with a lens or a light pipe becomes unnecessary, and is useful in a lighting source in which a field lens (objective lens) is disposed in front of the glass-coated light-emitting element, a projector device having this lighting source, or the like.

The invention claimed is:

1. A glass-coated light-emitting element comprising:
a semiconductor light-emitting element having a surface and a plurality of electrodes formed on the surface; and
a spherical glass having a sphere shape with a cut portion and covering the semiconductor light-emitting element such that the surface of the semiconductor light-emitting element forms a surface portion of the cut portion of the sphere shape,
wherein the sphere shape of the spherical glass has a spherical surface broader than a hemispherical surface, the spherical glass has a refractive index of 1.7 or more at an emission peak wavelength of the semiconductor light-emitting element, and a ratio of a diameter of the spherical surface to a maximum diameter of the surface of the semiconductor light-emitting element on which the electrodes are formed is 1.8 to 3.5.

2. A glass-coated light-emitting element according to claim 1, wherein the spherical glass is disposed by placing the spherical glass on an upper surface of the semiconductor light-emitting element, heating the spherical glass to soften, thereby coating the semiconductor light-emitting element, and cooling the spherical glass.

3. The glass-coated light-emitting element according to claim 1, wherein the semiconductor light-emitting element has a rectangular light-emitting portion.

4. The glass-coated light-emitting element according to claim 3, wherein a distance between a rotationally-symmetric axis of the spherical glass and a rotationally-symmetric axis of the rectangular light-emitting portion is 30 µm or less.

5. The glass-coated light-emitting element according to claim 1, wherein the refractive index of the glass is 2.3 or less.

6. The glass-coated light-emitting element according to claim 5, wherein the refractive index of the glass is 1.8 to 2.2, and the ratio is 2.0 to 3.2.

7. The glass-coated light-emitting element according to claim 1, wherein the semiconductor light-emitting element is a light-emitting diode.

8. The glass-coated light-emitting element according to claim 7, wherein the emission peak wavelength is 450 to 480 nm.

9. A light-emitting element-attached wiring board in which a wiring pattern formed on a surface of a wiring board and electrodes of the glass-coated light-emitting element according to claim 1 are electrically connected to each other with a bump.

10. A method for producing the light-emitting element-attached wiring board according to claim 9, said method comprising;

electrically connecting the electrodes of the semiconductor light-emitting element to the wiring pattern of the wiring board with the bump;

placing the spherical glass having the refractive index of 1.7 or more on the upper surface of the semiconductor light-emitting element;

heating the spherical glass to soften in such that the spherical glass does not contact with the wiring board or the wiring pattern thereof, thereby coating the semiconductor light-emitting element; and cooling to allow the spherical surface of the spherical glass.

11. A lighting device in which a field lens is disposed in front of the glass-coated light-emitting element of the light-emitting element-attached wiring board according to claim 9.

12. A lighting device in which a field lens is disposed in front of the glass-coated light-emitting element according to claim 1.

13. A projector having the lighting device according to claim 12 as a light source.

* * * * *